United States Patent
Mountain

(10) Patent No.: US 7,452,746 B1
(45) Date of Patent: Nov. 18, 2008

(54) METHOD OF FABRICATING A FLEXIBLE ORGANIC INTEGRATED CIRCUIT

(75) Inventor: David J Mountain, Baltimore, MD (US)

(73) Assignee: The Uniteed States of America as represented by the Director of National Security Agency, Washington, DC (US)

( * ) Notice: Subject to any disclaimer, the term of this patent is extended or adjusted under 35 U.S.C. 154(b) by 472 days.

(21) Appl. No.: 11/417,300

(22) Filed: Apr. 24, 2006

Related U.S. Application Data

(62) Division of application No. 11/130,368, filed on May 16, 2005, now abandoned.

(51) Int. Cl.
*H01L 51/40* (2006.01)

(52) U.S. Cl. .................. 438/99; 438/82; 257/E51.001

(58) Field of Classification Search .............. 438/82, 438/99; 257/E51.001–E51.052
See application file for complete search history.

(56) References Cited

U.S. PATENT DOCUMENTS

| 7,005,179 B2 * | 2/2006 | Davidson et al. ............ 428/209 |
| 2004/0266207 A1 * | 12/2004 | Sirringhauss et al. ....... 438/725 |
| 2006/0148167 A1 * | 7/2006 | Brown et al. ................ 438/232 |

* cited by examiner

*Primary Examiner*—Wai-Sing Louie
(74) *Attorney, Agent, or Firm*—Shlesinger, Ackwright & Garvey LLP; Terrence L.B. Brown

(57) ABSTRACT

Method of making an organic flexible integrated circuit includes providing a rigid substrate, such as a silicon wafer, and providing alternating layers of thin film conductors and dielectrics to thus yield interconnect layers including a flexible substrate on the rigid substrate to yield a high density interconnect. Further, the method includes fabricating an organic transistor, and connecting the organic transistor to the high density interconnect to form an organic integrated circuit including the flexible substrate. Then, the rigid substrate and the flexible substrate may be attached to a support. The integrated circuit attached to the rigid and flexible substrates may be tested prior to this attachment. Then the rigid substrate may be removed from the flexible substrate, such as by a destructive. The integrated circuit may be tested gain at this point. The organic integrated circuit may then be released from the support to yield a flexible integrated circuit.

8 Claims, 1 Drawing Sheet

METHOD OF FABRICATING A FLEXIBLE ORGANIC INTEGRATED CIRCUIT

This application is a divisional of U.S. patent application Ser. No. 11/130,368, filed on May 16, 2005, now abandoned the entire specification of which is incorporated by reference herein.

FIELD OF THE INVENTION

The invention relates to a method of making an integrated circuit. More particularly, the method relates to the fabricating of an organic flexible integrated circuit. Even more particularly, the method relates to fabricating an organic flexible integrated circuit including organic transistors and high density interconnects including a flexible substrate, such as polyimide and/or BCB.

BACKGROUND OF THE INVENTION

Organic integrated circuits are known.

Applicant's earlier patents directed to semiconductor device manufacturing processes include:

U.S. Pat. No. 6,013,534 to Mountain, entitled "Method of Thinning Integrated Circuits Received in Die Form", issued Jan. 11, 2000, which is incorporated herein by reference; and U.S. Pat. No. 6,017,822 to Mountain, entitled "Method of Thinning Semiconducted Wafer of Smaller Diameter than Thinning Equipment Was Designed For", issued Jan. 25, 2000, and which is incorporated herein by reference.

Additional known United States patent documents include:

U.S. Pat. No. 5,970,318 to Choi et al.;
U.S. Pat. No. 6,403,397 B1 to Katz;
U.S. Pat. No. 6,551,717 B2 to Katz et al.;
U.S. Pat. No. 6,150,668 to Bao et al.;
U.S. Pat. No. 6,635,508 B2 to Arai et al.;
U.S. Pat. No. 6,303,219 B1 to Sawamura et al.; and
U.S. Pat. Pub. No. US2002/0072149 A1 to Yoshida.

Transistors and interconnect patterning processes are known in the wafer fabrication and wafer-level packaging industries. Known organic flexible substrates which have been proposed for organic integrated circuits typically have relatively low service temperatures; i.e. service temperatures of 150° C. or less.

There is a need for flexible integrated circuits having longer service lives, greater service temperature ranges, and more varied and larger configurations than known in the art.

OBJECTS AND SUMMARY OF THE INVENTION

It is an object of the invention to overcome the drawback of the prior art. It is a further object of the invention to provide a method of fabricating organic integrated circuits.

A further object of the invention is to provide a method of fabricating flexible integrated circuits.

Yet another object of the invention is to provide flexible integrated circuits which have service temperatures above 150° C., and, indeed, a service temperature of 350° C. or higher.

A still further object of the invention is to manufacture flexible integrated circuits having larger flexible substrates than had been previously known, such flexible substrates being usable as large area displays, identification tags, such as identification tags for objects and materials, electronic paper (i.e., writing surfaces), and the like.

Another object of the invention is to provide flexible integrated circuits which have irregular shapes; e.g., outer perimeters of varied slopes and angles.

Another object of the invention is to provide a method of fabricating flexible organic integrated circuits which are inexpensive to produce and readily manufactured.

In summary, the invention is directed to a method of making an organic flexible integrated circuit. The method includes providing a rigid substrate, such as a silicon wafer, and providing alternating layers of thin film conductors and dielectrics to yield interconnect layers including a flexible substrate on the rigid substrate to yield a high density interconnect. Further, the method includes fabricating an organic transistor, and connecting the organic transistor to the high density interconnect to form an organic integrated circuit including the flexible substrate. Then the rigid substrate and the flexible substrate may be attached to a support, such as handle wafer. The rigid substrate and the flexible substrate attached to the support may be heat treated. Then, the rigid substrate may be removed from the flexible substrate, such as by a destructive process including grinding, polishing, and etching, for example. The organic integrated circuit including the flexible substrate may be released from the support to yield a flexible integrated circuit, or it may be left on the support for shipping or for further processing.

Further, the invention may include the attaching of the flexible substrate to the support by an adhesive, such as an acrylic, which is readily removable with a solvent, such as acetone.

The adhesive may likewise include a wax, or other compound sufficiently strong to attach the substrate to the support during the processing steps.

The interconnect may include a copper/polyimide thin film interconnect.

The flexible substrate may include a material such as polyimide or BCB (e.g.; bisbenzocyclobutene or benzocyclobutane).

Relative terms such as left, right, up, and down are for convenience only and are not intended to be limiting.

DETAILED DESCRIPTION OF THE INVENTION

Figure 1:
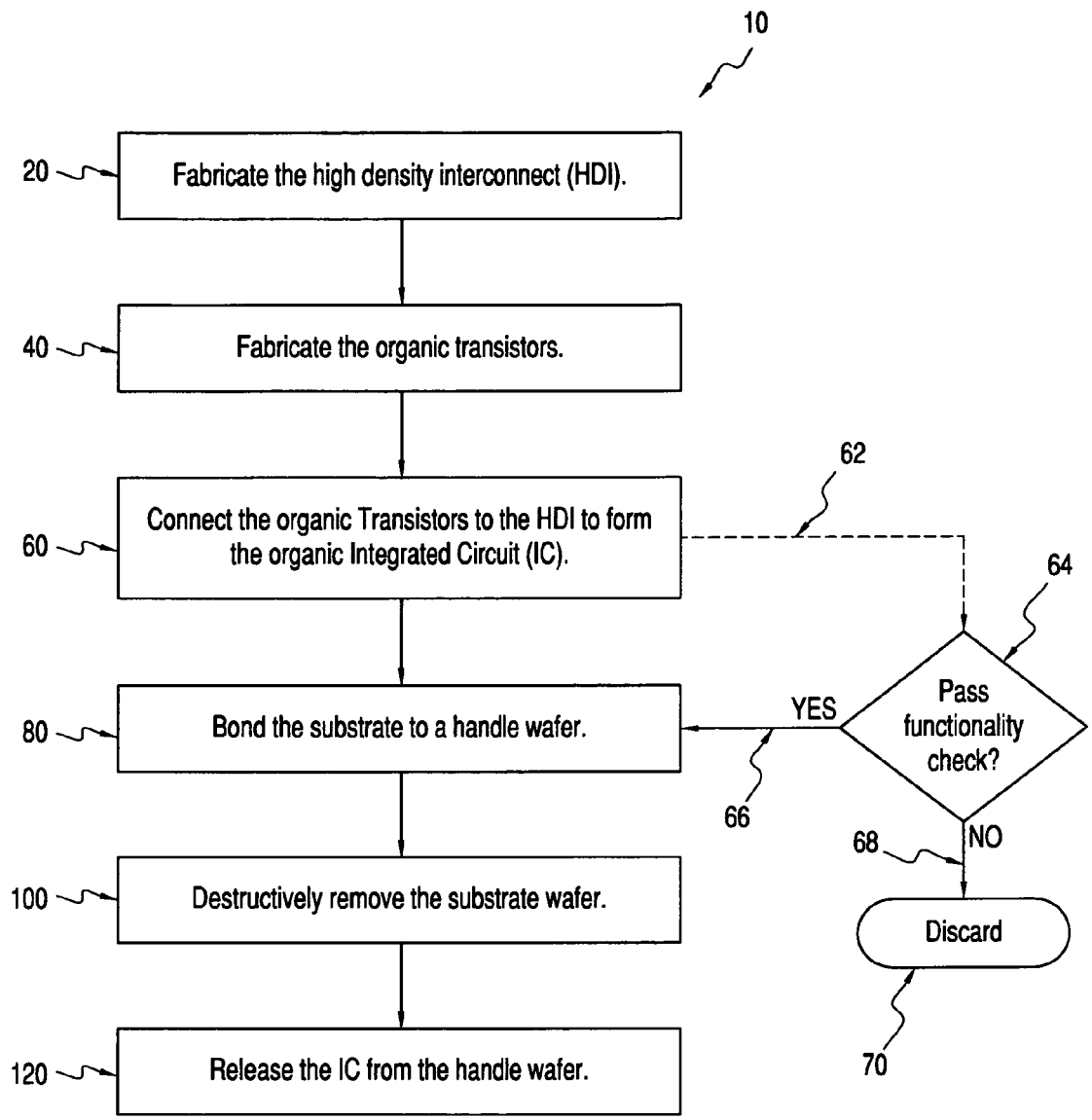
FIG. 1 illustrates a flow chart of a process for producing a flexible integrated circuit according to the invention.

FIG. 1 schematically shows a method or process 10 for producing a flexible integrated circuit according to the invention in the form of a flowchart.

Process 10 for fabricating the flexible organic integrated circuit (IC) may be understood as a series of process steps shown in FIG. 1.

For ease of discussion, a step 20 may be considered the first step of fabricating a high density interconnect (HDI) which includes a flexible substrate and which may conveniently be fabricated on a rigid substrate.

The high density interconnect may be made using a known process of providing alternating layers of patterned thin film conductors and dielectrics on a silicon substrate to make the interconnect.

Further, it will be readily understood that the layers may be copper/polyimide thin film interconnect (TFI) layers.

The silicon substrate will serve as the rigid substrate on which those layers are fabricated. The silicon substrate may be a known wafer-sized substrate, such as a 150 millimeter (mm) diameter silicon wafer. Likewise, 200 mm and 300 mm in diameter silicon wafers may be used, depending on the end use and the fabrication equipment available, for example.

A next process step 40 may be considered a second process step in which one fabricates organic transistors. Such organic transistors may be fabricated in accordance with readily available processes. It will be appreciated that such organic transistor fabrication of step 40 may be carried out along the lines described in the above-referenced U.S. Pat. No. 5,970,318 to Choi et al., U.S. Pat. No. 6,403,397 B1 to Katz, and U.S. Pat. No. 6,551,717 B2 to Katz et al., each of which is incorporated herein by reference.

The manufacturer may then connect the thus made organic transistors fabricated in step 40 to the high density interconnect (HDI) fabricated in step 20 to form an organic integrated circuit (IC), as shown in step 60. This connection of the organic transistors to the HDI may be carried out with known methodology, such as commercially proven dielectric deposition and patterning to form vias between the organic transistors and the copper of the above-described copper/polyimide thin film interconnect layers, for example.

One may then use readily available fabrication equipment to provide metal deposition and patterning to complete the desired connections, as will be readily appreciated by a person having ordinary skill in the art, and thus form the desired high density organic integrated circuit(s).

It is contemplated that the same processes used to fabricate the high density interconnect (HDI) in step 20 above may be used in this step 60. Desired connections to the external environment may be created at this same time.

An optional decision path 62 leading to an optional step 64 of checking the functionality of the IC formed in step 60 may be performed at this point. Optional step 64 has been designated a "pass functionality check" decision. If the IC is functional; i.e. passes the functionality check, as schematically shown by the YES response 66, then the fabrication process 10 would continue at a step 80. If the answer to the functionality check at step 64 is a NO, as shown by path 68, then the manufacturer would discard or otherwise dispose of the partially formed electronic device as shown by a terminus or terminator 70 labeled "discard" in FIG. 1. It will be appreciated that the nonfunctioning partially formed IC may be recycled or otherwise used at this point.

If the functionality check has been passed (i.e., the logic query answer is a YES), if that option is utilized, or if the process 10 had proceeded directly from step 60 to a stop 80, as shown, then the manufacturer may perform step 80 of attaching the flexible substrate to a support.

Such a support may be in the form of a known handle wafer or other support configured and adequate for supporting the flexible substrate of the organic IC. The handle wafer may be made of a known material such as glass.

The handle wafer material may be other materials in addition to glass, such as stainless steel, or any material compatible with the adhesive (e.g. acrylic) and the bonding process described immediately below.

The attaching of the flexible substrate may be carried out by bonding the flexible substrate to the handle wafer with an adhesive material, such as acrylic, and the acrylic may be spun onto one or both of the handle wafer and the flexible substrate; i.e. the acrylic may be spun onto a surface of the flexible substrate that will face the handle wafer, and the acrylic may likewise be spun on the counterpart surface of the handle wafer which will face the flexible substrate. The flexible substrate will thus be adhered to the handle wafer and then soft baked in accordance with a known process, for example.

After the bonding process the process 10 may include a step 100 of removing the rigid substrate from the flexible substrate. That is, in the case where a silicon wafer is used as the rigid substrate, the silicon substrate wafer may be removed by using a known, readily available process including one or more of grinding, etching, and polishing, for example. That removal may be a destructive removal process. Appropriate equipment is readily available for carrying out such processes of removing the rigid substrate from a further substrate. After the rigid substrate has been removed in step 100, the thus formed flexible integrated circuit remains adhered to the support; e.g. the handle wafer. Depending on the intended end use, the flexible integrated circuit may be shipped or further processed while still adhered to the handle wafer.

In the case where it is desired to have the flexible integrated circuit released from the handle wafer, a step 120 of releasing the IC having the flexible substrate will be performed. The releasing of the flexible IC from the support may be accomplished by using an acetone soak, in the case where acrylic has been used as the adhesive.

It will be readily appreciated that when other adhesives instead of acrylic are used different solvents may be used that are appropriate for dissolving or releasing such alternate adhesives. Alternate adhesives for adhering the flexible substrate to the support may include a wax, a polyvinyl alcohol (which may include a surfactant), TECHNIKOTE™, or POLYMARK™ such as supplied by Engineered Materials Systems, Inc., Delaware, Ohio USA 43015; www.engmatsys.com). POLYMARK™ may be used as a substitute adhesive for an acrylic.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention or limits of the claims appended hereto.

What is claimed is:

1. Method of making a device, comprising:
   a) providing a rigid substrate;
   b) providing alternating layers of thin film conductors and dielectrics to yield interconnect layers including a flexible substrate on the rigid substrate to yield a high density interconnect;
   c) fabricating an organic transistor;
   d) connecting the organic transistor to the high density interconnect to form an organic integrated circuit including the flexible substrate;
   e) testing the organic integrated circuit for functionality after connecting the organic transistor to the high density interconnect;
   f) attaching the rigid substrate and the flexible substrate to a support;
   g) heat treating the rigid substrate and the flexible substrate attached to the support in the attaching step; and
   h) removing the rigid substrate from the flexible substrate.

2. Method as in claim 1, further including the step of:
   a) releasing the flexible substrate from the support to yield a flexible integrated circuit.

3. Method as in claim 2, further including the step of:
   a) testing the organic integrated circuit for functionality after removing the rigid substrate from the flexible substrate.

4. Method as in claim 1, further:
a) testing the organic integrated circuit for functionality after removing the rigid substrate from the flexible substrate.

5. Method of making a device, comprising:
a) providing a rigid substrate;
b) providing alternating layers of thin film conductors and dielectrics to yield interconnect layers including a flexible substrate on the rigid substrate to yield a high density interconnect;
c) fabricating an organic transistor;
d) connecting the organic transistor to the high density interconnect to form an organic integrated circuit including the flexible substrate;
e) attaching the rigid substrate and the flexible substrate to a support;
f) heat treating the rigid substrate and the flexible substrate attached to the support in the attaching step; and
g) removing the rigid substrate from the flexible substrate;
h) testing the organic integrated circuit for functionality after removing the rigid substrate from the flexible substrate.

6. Method as in claim 1, further including the step of:
a) releasing the flexible substrate from the support to yield a flexible integrated circuit.

7. Method as in claim 6, further including the step of:
a) testing the organic integrated circuit for functionality after connecting the organic transistor to the high density interconnect.

8. Method as in claim 5, further:
a) testing the organic integrated circuit for functionality after connecting the organic transistor to the high density interconnect.

* * * * *